United States Patent [19]

Tanabe et al.

[11] Patent Number: 4,673,253

[45] Date of Patent: Jun. 16, 1987

[54] METHOD OF MAKING A LIQUID CRYSTAL DISPLAY WITH COLOR FILTERS

[75] Inventors: Hiroshi Tanabe, Saitama; Etsuo Yamamoto, Tokyo; Seigo Togashi; Kanetaka Sekiguchi, both of Saitama; Katsumi Aota, Tokyo; Kazuaki Sorimachi, Saitama, all of Japan

[73] Assignee: Citizen Watch Co., Ltd., Tokyo, Japan

[21] Appl. No.: 848,894

[22] Filed: Apr. 4, 1986

Related U.S. Application Data

[63] Continuation of Ser. No. 652,327, Sep. 19, 1984, abandoned.

[30] Foreign Application Priority Data

Oct. 7, 1983 [JP] Japan ................................ 58-186982

[51] Int. Cl.⁴ .......................... G02F 1/13; C09K 19/00
[52] U.S. Cl. ................................ 350/339 F; 350/320; 430/20
[58] Field of Search ................ 350/339 F, 320; 428/1, 428/108; 430/313, 20

[56] References Cited

U.S. PATENT DOCUMENTS

| | | | |
|---|---|---|---|
| 3,619,041 | 11/1971 | Willoughby | 350/311 |
| 3,840,695 | 10/1974 | Fischer | 350/339 F X |
| 4,236,098 | 9/1979 | Horak et al. | 350/317 X |
| 4,271,246 | 6/1981 | Sato et al. | 350/317 X |
| 4,470,667 | 9/1984 | Okubo et al. | 350/334 X |
| 4,518,225 | 5/1985 | Frederickson et al. | 350/339 F X |
| 4,552,437 | 11/1985 | Gantenbrink et al. | 350/339 F X |

FOREIGN PATENT DOCUMENTS

| | | | |
|---|---|---|---|
| 0123030 | 10/1978 | Japan | 350/317 |
| 0081310 | 6/1980 | Japan | 350/317 |
| 0144524 | 9/1982 | Japan | 350/311 |
| 0083112 | 4/1984 | Japan | 350/311 |

OTHER PUBLICATIONS

Weaver "Lift-Off Method of Fabricating Thin Films" IBM Technical Disclosure Bulletin, vol. 17, No. 2, Jul. 1974, pp. 351-352.

Primary Examiner—John K. Corbin
Assistant Examiner—David Lewis
Attorney, Agent, or Firm—Koda and Androlia

[57] ABSTRACT

A liquid crystal display device having a color filter comprises a liquid crystal shutter device, at least one color filter layer formed on one surface of the liquid crystal shutter device, and at least one diffusion preventing layer for protecting the color filter layer. The color filter layer is prepared by a photolithographic process comprising the steps of forming a layer being colored of gelatin and the like on one surface of the liquid crystal shutter device, coating a photoresist layer thereon, while illuminating the liquid crystal shutter device by white light from the other surface thereof, applying a voltage to the selected opposed surface thereof, applying a voltage to the selected opposed electrode groups to form a latent image in alignment with the electrode groups by a photochemical action, developing the latent image to form a photomask, and while using this mask as a guide, coloring the layer being colored.

3 Claims, 31 Drawing Figures

WHITE LIGHT

WHITE LIGHT

WHITE LIGHT

WHITE LIGHT

WHITE LIGHT

METHOD OF MAKING A LIQUID CRYSTAL DISPLAY WITH COLOR FILTERS

This is a continuation of application Ser. No. 652,327 filed Sept. 19, 1984, now abandoned.

BACKGROUND OF THE INVENTION

1. Field of the Invention

This invention relates to a liquid crystal display device having a color filter and more particularly to a liquid crystal display device having a color filter which permits self alignment with electrode groups of the liquid crystal display device by a photolithographic method.

2. Description of the Prior Art

Color filters for use with a display device, more particularly with a liquid crystal display device, are now being realized. Full-color liquid crystal display devices comprise a plane-distributed liquid crystal shutter device and a multicolor filter positioned on the oppositie side of the liquid crystal shutter device.

The above full-color liquid crystal display devices, for example, of the types shown in FIGS. 1 and 2, respectively, are divided into two broad general parts: a liquid crystal shutter device 20 and a plane-distributed color filter 22. Each of the liquid crystal shutter devices 20 has a pair of opposed glass plates 1, 2; opposed electrode groups 3, 4 on the respective inner surfaces of the glass plates 1, 2; polarizers 5, 6; a liquid crystal layer 7 between the opposed electrode groups 3, 4; and a voltage applying means (not shown) for selectively applying a voltage across the electrode groups 3, 4, and there are active and passive types. Also, the plane-distributed color filters 22 are available in two types: one, as shown in FIG. 1, provided with a single filter 11 having the spectral characteristic of three primary colors of blue 11', red 11" and green 11''' and a diffusion preventing layer 15 deposited thereon; and the other, as shown in FIG. 2, of a structure in which a plurality of filter layers 11', 14', 17' and diffusion preventing layers 13, 16, 19 are laminated alternately.

These plane-distributed filters 22 are prepared by placing a dye layer on a plate 21, then patterning and dyeing the layer, and coating the diffusion preventing layer on the dye layer. In the case of the three primary colors, this process is repeated three times. Thus, the conventional process for fabricating a color filter requires a resist exposure mask for each color each time the dye layer is patterned. This fabricating process has the drawback that it takes much time and is also complicated, thus resulting in high production costs.

SUMMARY OF THE INVENTION

An object of the invention is to overcome the above-mentioned drawback and to provide a liquid crystal display device having a plane-distributed color filter of excellent quality integral with a liquid crystal shutter by a very effective process.

According to one aspect of the invention, there is provided a liquid crystal display device having a color filter comprising: a liquid crystal shutter device having, a pair of opposed glass plates, opposed electrode groups on the respective inner surfaces of the glass plates, at least one polarizer, a liquid crystal layer between the opposed electrode groups, and a voltage applying means for selectively applying a voltage across the electrode groups; a color filter layer prepared by a photolithographic process comprising the steps of, forming a layer being colored on one surface of the liquid crystal shutter device, forming a photoresist layer thereon, while illuminating the liquid crystal shutter device from the other surface thereof by white light, applying the voltage across the selected opposed electrode groups through the voltage applying means to form a latent image on the photoresist layer by a photochemical action, the latent image being aligned with the electrode groups, developing the latent image to form a photomask, and after a while, while using the photomask as a guide, coloring the layer being colored; and at least one diffusion preventing layer for protecting the color filter layer.

According to another aspect of the invention, there is provided a liquid crystal display device having a color filter comprising: a liquid crystal shutter device having, a pair of opposed glass plates, opposed electrode groups on the respective inner surfaces of the glass plates, at least one polarizer, a liquid crystal layer between the opposed electrode groups, and a voltage applying means for selectively applying a voltage across the electrode groups; a color filter layer prepared by a photolithographic process comprising the steps of, forming a first layer being colored on one surface of the liquid crystal shutter device, forming a first photoresist layer of a negative type thereon, while illuminating the liquid crystal shutter device from the other surface thereof by white light, applying the voltage across the first selected opposed electrode groups through the voltage applying means to prevent the light from passing through a portion of the liquid crystal layer to which the voltage is applied and to expose a portion of the photoresist layer sensitive to the light, thereby forming a first pattern latent image, the first pattern latent image being hardened, developing the first latent image to form a first pattern mask, while using the mask as a guide, etching away the portion of the first layer being colored corresponding to the first selected opposed electrode groups, removing the mask, coating and dyeing the unetched portion of the first layer being colored with a first color of three primary colors to form a first colored layer, and forming a first diffusion preventing layer on an upper surface of the first colored layer; forming a second layer being colored and a second photoresist layer of the negative type on an upper surface of the first preventing layer, while illuminating the liquid crystal shutter device from the other surface thereof by white light, applying the voltage across the second selected opposed electrode groups through the voltage applying means to prevent the light from passing through a portion of the liquid crystal layer to which the voltage is applied and to expose a portion of the second photoresist layer sensitive to the light, thereby forming a second pattern latent image, the second pattern latent image being hardened, developing the second latent iamge to form a second pattern mask, while using the mask as a guide, etching away the portion of the second layer being colored corresponding to the second selected opposed electrode groups, removing the mask, coating and dyeing the unetched portion of the second layer being colored with a second color of the three primary colors to form a second colored layer, and forming a second diffusion preventing layer on an upper surface of the second colored layer; and forming a third layer being colored and a third photoresist layer of the negative type on an upper surface of the second preventing layer, while illuminating the liquid crystal shutter device from the other surface thereof by white light, applying the voltage across the third selected opposed electrode groups through the voltage applying means to prevent the light from passing through a portion of the liquid crystal layer to which the voltage is applied and to expose a portion of the third photoresist layer sensitive to the light, thereby forming a third pattern latent image, the third pattern latent image being hardened, developing the third pattern latent image to form a third pattern mask, while using the mask as a guide, etching away the portion of the third layer being colored corresponding to the third selected opposed electrode groups, removing the mask, coating and dyeing the unetched portion of the third layer being colored with a third color of the three primary colors to form a third colored layer, and forming a third diffusion preventing layer on an upper surface of the third colored layer.

According to a further aspect of the invention, there is provided a liquid crystal display device having a color filter comprising: a liquid crystal shutter device having, a pair of opposed glass plates, opposed electrode groups on the respective inner surfaces of the glass plates, at least one polarizer, a liquid crystal layer between the opposed electrode groups, and a voltage applying means for selectively applying a voltage across the electrode groups; and a color filter layer prepared by a photolithographic process comprising the steps of, forming a layer being colored on one surface of the liquid crystal shutter device, forming a first photoresist layer of a positive type thereon, while illuminating the liquid crystal shutter device from the other surface thereof by white light, applying the voltage across the first selected opposed electrode groups through the voltage applying means to prevent the light from passing through a portion of the liquid crystal to which the voltage is applied and to expose a portion of the first photoresist layer sensitive to the light, thereby forming a first latent image which is soluable, developing the latent image to leave the unexposed portion of the first photoresist layer, thereby forming a mask for a first coloring guide, pouring a dye of a first color of three primary colors into the first layer being colored from a hole therein caused by the solution of the mask to form a first colored portion, and removing the mask to reveal the layer being colored having the first colored portion; forming a second photoresist layer of the positive type on an upper surface of the layer being colored, while illuminating the liquid crystal shutter device from the other surface thereof by white light, applying the voltage across the second selected opposed electrode groups through the voltage applying means to prevent the light from passing through a portion of the liquid crystal to which the voltage is applied and to expose a portion of the second photoresist layer sensitive to the light, thereby forming a second latent image which is soluable, developing the latent image to leave the unexposed portion of the second photoresist layer, thereby forming a mask for a second coloring guide, pouring a dye of a second color of the three primary colors into the second layer being colored from a hole therein caused by the solution of the mask to form a second colored portion, and removing the mask to reveal the layer being colored having the first and second colored portions; and forming a third photoresist layer of the positive type of the upper surface of the layer being colored, while illuminating the liquid crystal shutter device from the other surface thereof by white light, applying the voltage across the third selected opposed electrode groups through the voltage applying means to prevent the light from passing through a portion of the liquid crystal to which the voltage is applied and to expose a portion of the third photoresist layer sensitive to the light, thereby forming a third latent image which is soluable, developing the latent image to leave the unexposed portion of the third photoresist layer, thereby forming a mask for a third coloring guide, pouring a dye of a third color of the three primary colors into the third layer being colored from a hole therein caused by the solution of the mask to form a third colored portion, removing the mask to reveal the layer having the first, second and third colored portions, part of the first, second and third portions being overlapping, and forming a diffusion preventing layer on the upper surface of the layer having the first, second and third colored portions.

DETAILED DESCRIPTION OF THE PREFERRED EMBODIMENTS

Figure 1:
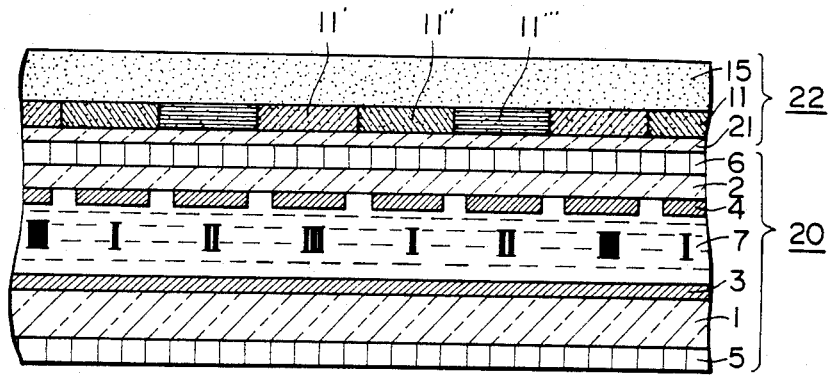
FIG. 1 is a partially sectional view of one prior art liquid crystal display device having a color filter.
Figure 2:
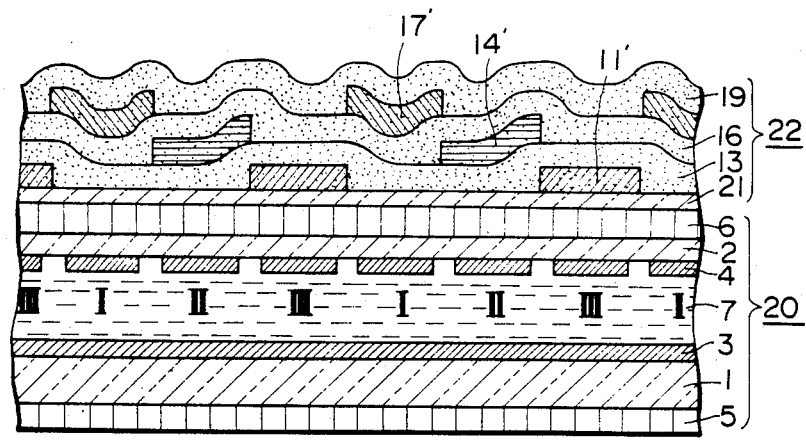
FIG. 2 is a partially sectional view of another prior art liquid crystal display device having a color filter.
Figure 3A:
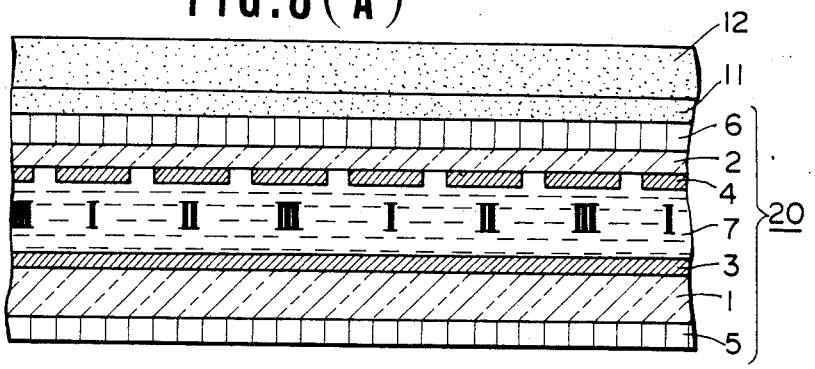
FIGS. 3 (A) to 3 (O) are partially sectional views of one embodiment illustrating a fabricating process and a finished product of a liquid crystal display device having a color filter in accordance with the invention.
Figure 3B:
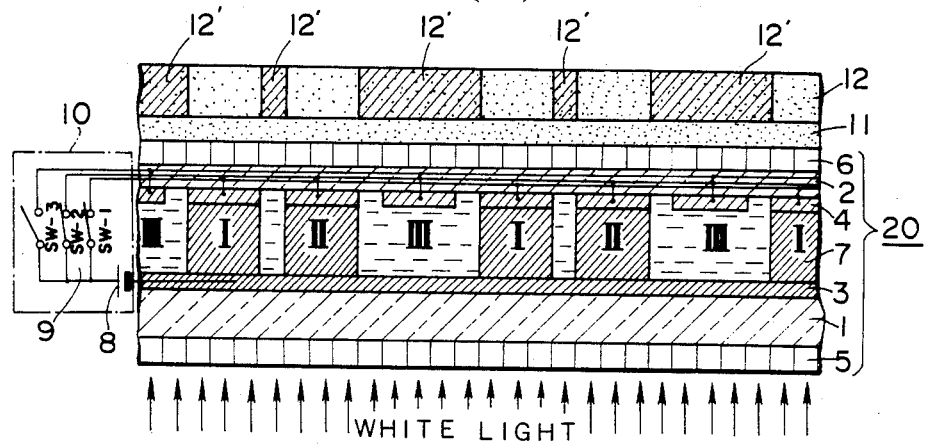
Figure 3C:
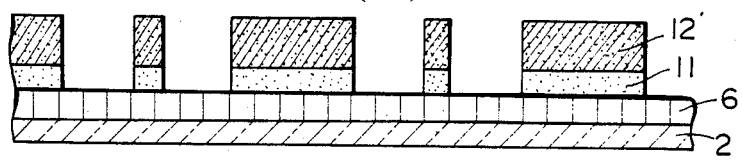
Figure 3D:
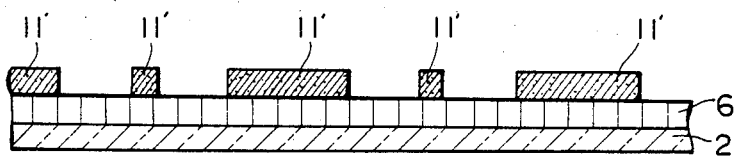
Figure 3E:
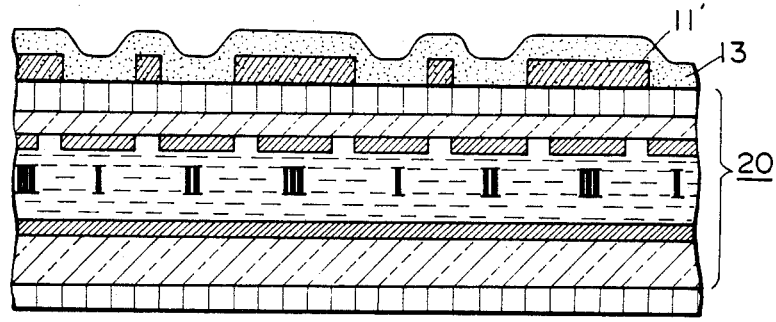
Figure 3F:
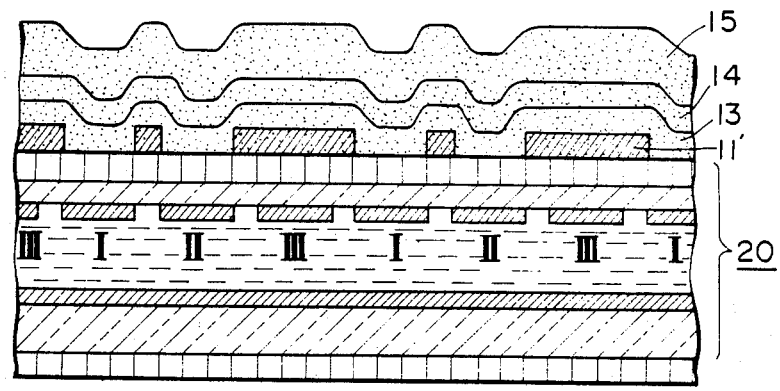
Figure 3G:
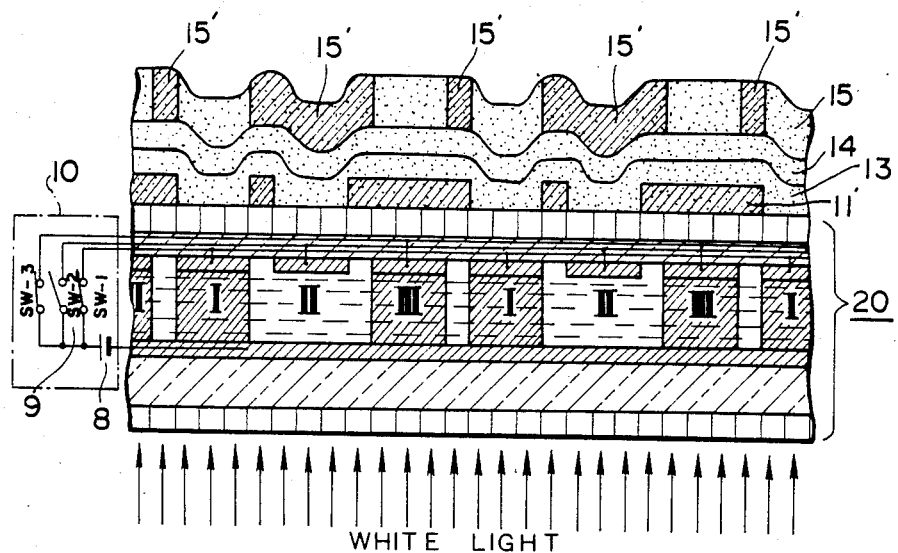
Figure 3H:
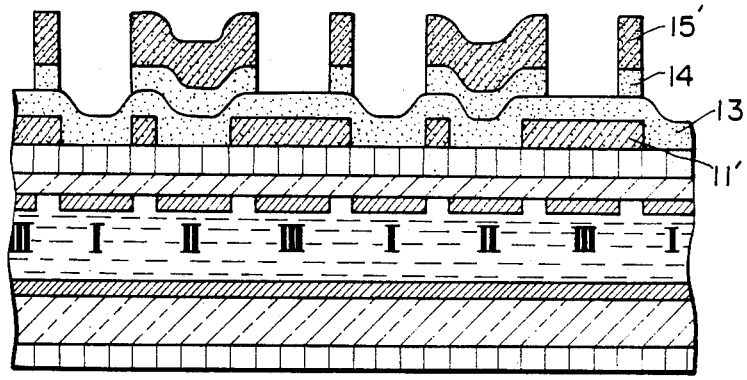
Figure 3I:
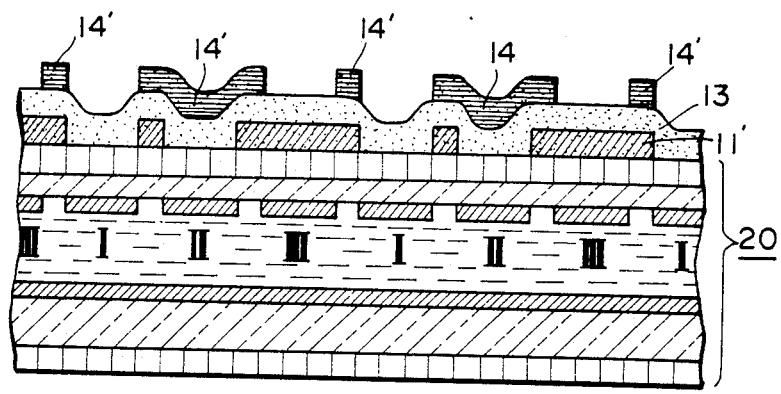
Figure 3J:
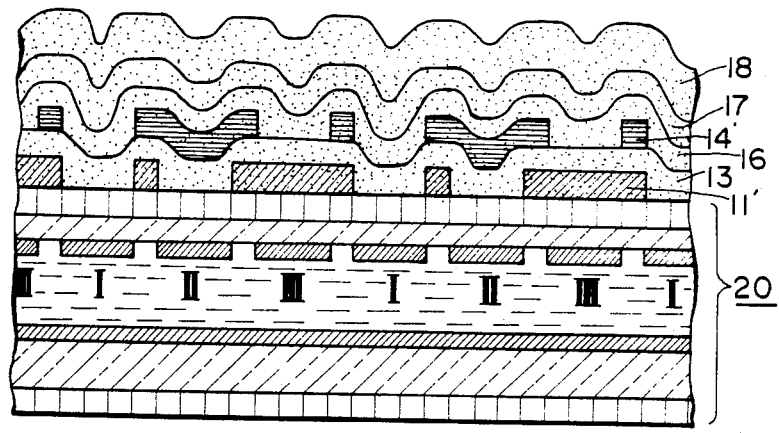
Figure 3K:
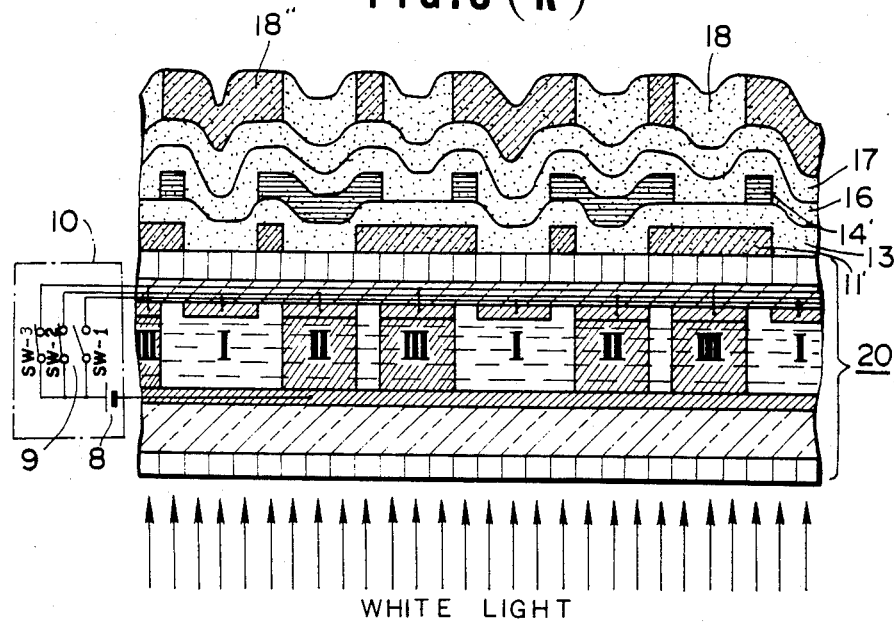
Figure 3L:
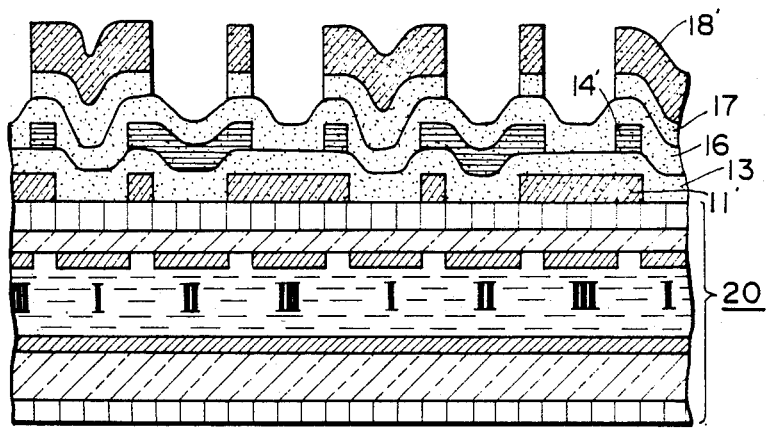
Figure 3M:
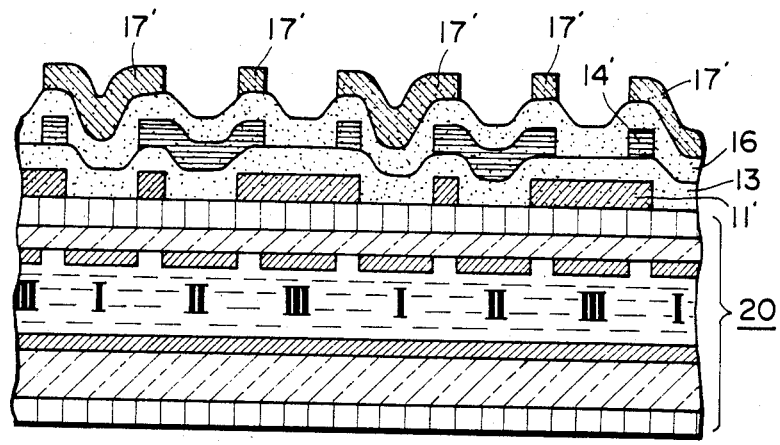
Figure 3N:
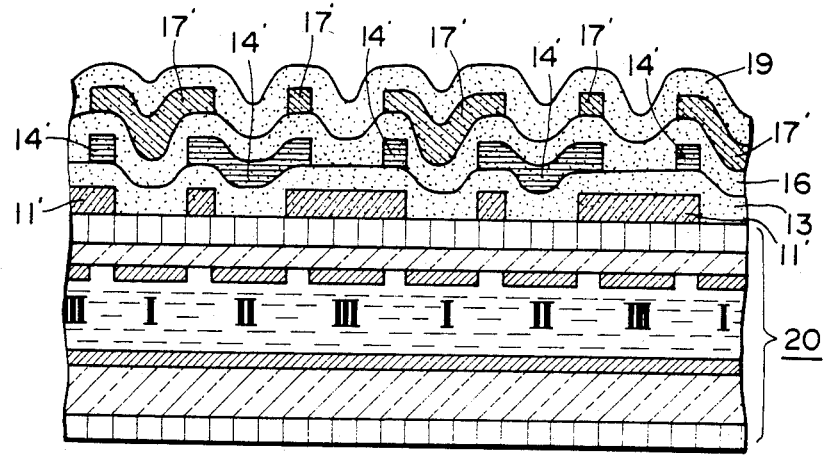
Figure 3O:
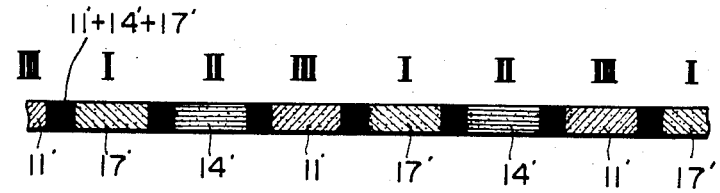

FIGS. 3 (A) to 3 (O) show a fabricating process and a finished product of a first embodiment of the invention formed in a photolithographic method by superposing a multilayer and multicolor filter 11', 14' 17' on one surface of a liquid crystal shutter device 20, the liquid crystal shutter device 20 having a pair of opposed glass plates 1, 2; opposed electrode groups 3, 4 on the respective inner surfaces of the glass plates 1, 2; at least one polarizer 5 or 6; a liquid crystal layer 7 sealed between both glass plates 1, 2; and a voltage applying means 10 for selectively applying a voltage across the electrode groups 3, 4.

Referring now to FIG. 3 (A), a first layer being colored 11 of gelatin and the like was disposed on the polarizer 6 of the liquid crystal shutter device 20, and a first photoresist layer 12 of a negative type including a crosslinking agent was disposed thereon. Next, as shown in FIG. 3 (B), while the liquid crystal shutter device 20 was illuminated from the rear by white light, SW-1 and SW-2 were closed with SW-3 open to apply a voltage to the selected portions of the liquid crystal layer 7. As a result, the light was prevented from passing through the portions I and II of the liquid crystal layer 7 corresponding to the electrode groups to which the voltage was applied through SW-1 and SW-2, and latent images 12' were formed on the portions of the first photoresist layer 12 exposed to the light. That is to say, the portions exposed to the light exhibited a reticular structure and hardened by the crosslinking agent contained in the photoresist layer 12. This made a difference in solubility between the exposed and unexposed portions with respect to a developer. Furthermore, addition of a developer left only the hardened portions carrying latent images 12' of the first photoresist layer 12 to produce a first pattern mask. While using this mask as a guide, the portions of the first layer being colored 11 corresponding to the portions I and II were etched away as shown in FIG. 3 (C). The first pattern mask was then scraped off, and as shown in FIG. 3 (D), the unetched portions of the first layer being colored 11 were coated with a dye of one of the three primary colors, for example, blue, to form a first colored layer 11'. After that, as shown in FIG. 3 (E), a first diffusion preventing layer 13 was formed on the upper surface of the first colored layer 11'.

In FIG. 3 (F), on the upper surface of the first diffusion preventing layer 13 were deposited a second layer being colored 14 of gelatin and the like and a second photoresist layer 15. As shown in FIG. 3 (G), while the liquid crystal shutter device 20 was illuminated from the rear by white light, SW-1 and SW-3 were closed with SW-2 open to apply the voltage to the selected portions of the liquid crystal layer. As a result, the light was prevented from passing through the portions I and III of the liquid crystal layer to which the voltage was applied through SW-1 and SW-3, and latent images 15' were formed on the portions of the second photoresist layer 15 exposed to the light. Furthermore, addition of the developer left only the portions carrying the latent images 15' to produce a second pattern mask. While using this mask as a guide, the portions of the second layer being colored 14 corresponding to the portions I and III were etched away as shown in FIG. 3 (H). The second pattern mask was then scraped off, and as shown in FIG. 3 (I), the unetched portions of the second layer being colored 14 were coated with a dye of another color of the three primary colors, for example, green, to form a second colored layer 14'. After that, as shown in FIG. 3 (J), on the upper surface of the second color layer 14' was formed a second diffusion preventing layer 16.

On the upper surface of the layer 16 were formed a third layer being colored 17 of gelatin and the like and a third photoresist layer 18 of the negative type having the same quality as those of the first and second photoresist layers 13, 16. As shown in FIG. 3 (K), while the liquid crystal shutter device 20 was illuminated from the rear by white light, SW-2 and SW-3 were closed with SW-1 open to apply the voltage to the selected portions of the liquid crystal layer. As a result, the light was prevented from passing through the portions II and III of the liquid crystal layer corresponding to the electrode groups to which the voltage was applied through SW-2 and SW-3, and latent images 18' were formed on the portions of the third photoresist layer 18 exposed to the light. Furthermore, addition of the developer left the portions carrying the latent images 18' to produce a third pattern mask. While using this mask as a guide, the portions of the third layer being colored 17 corresponding to the portions II and III were etched away as shown in FIG. 3 (L). The third pattern mask was then scraped off, and as shown in FIG. 3 (M), the unetched portions of the third layer being colored 17 were coated with a dye of the remaining color of the three primary colors, for example, red, and as shown in FIG. 3 (N), a third diffusion preventing layer 19 was formed thereon.

Figure 5A:
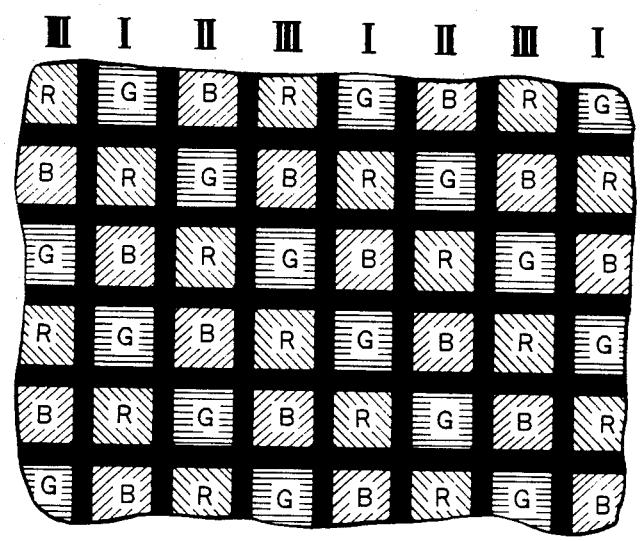
FIGS. 5 (A) to 5 (B) are partially front views of pictures produced by the above liquid crystal display devices each having a color filter in accordance with the invention.
Figure 5B:
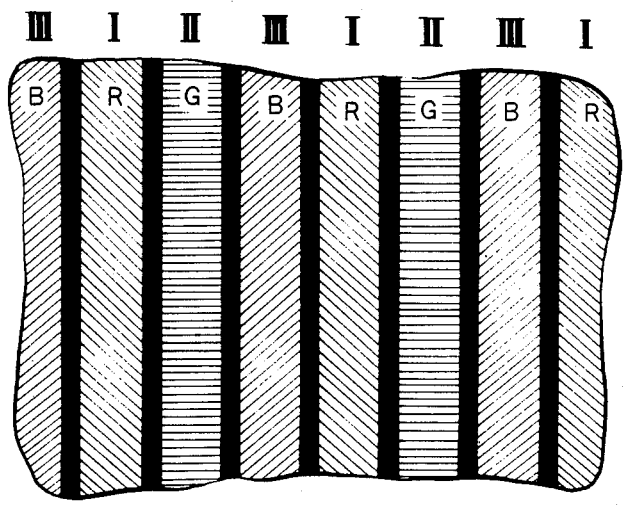

In this photolithographic method, there was provided a filter having a multilayer structure in which the color layers of the three primary colors and the diffusion preventing layers were laminated alternately, and aligned in a plane parallel to the planes of the electrodes of the liquid crystal shutter device. On the boundary regions where all the three primary colors overlapped, a black color was produced. Thus, the filter had a section like that shown in FIG. 3 (O). Also, when viewed from the top of the filter, black stripes were seen as shown in FIGS. 5 (A) and 5 (B).

Figure 4:
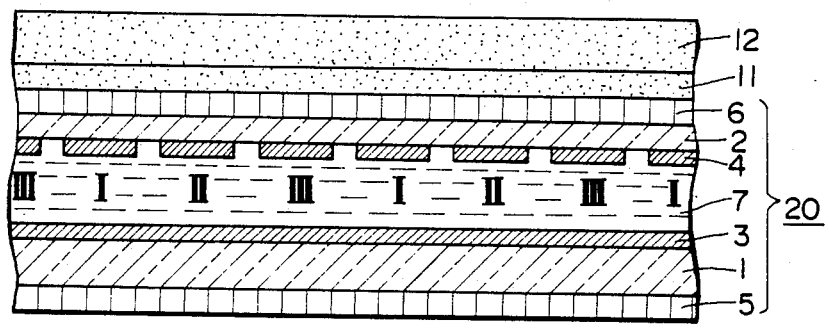
FIGS. 4 (A) to 4 (L) are partially sectional views of another embodiment illustrating a fabricating process and a finished product of a liquid crystal display device having a color filter in accordance with the invention.
Figure 4:
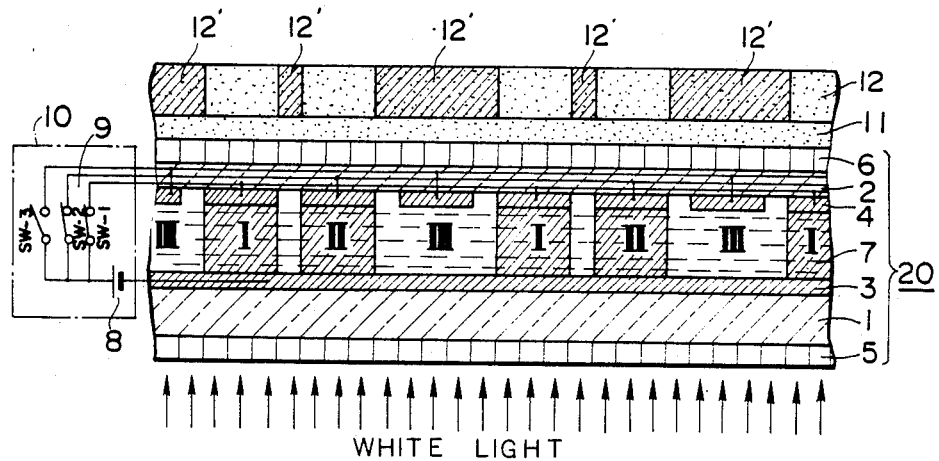
Figure 4:
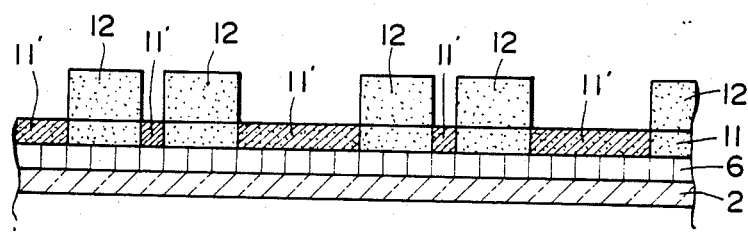
Figure 4:
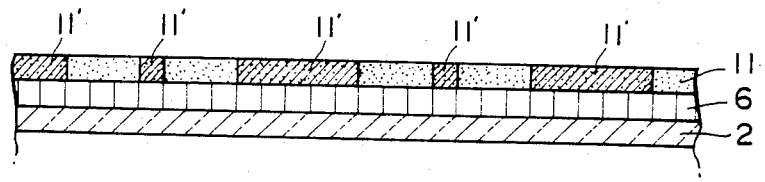
Figure 4:
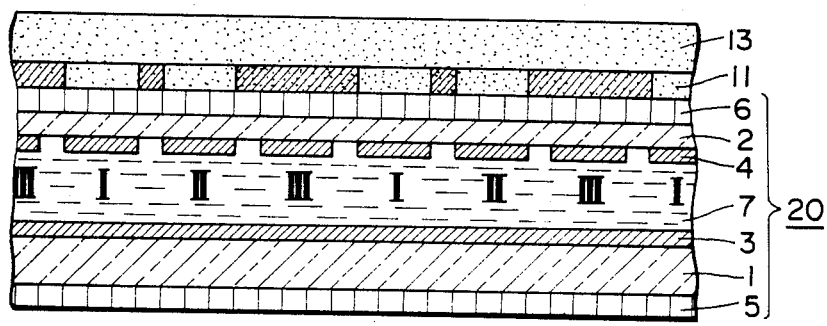
Figure 4:
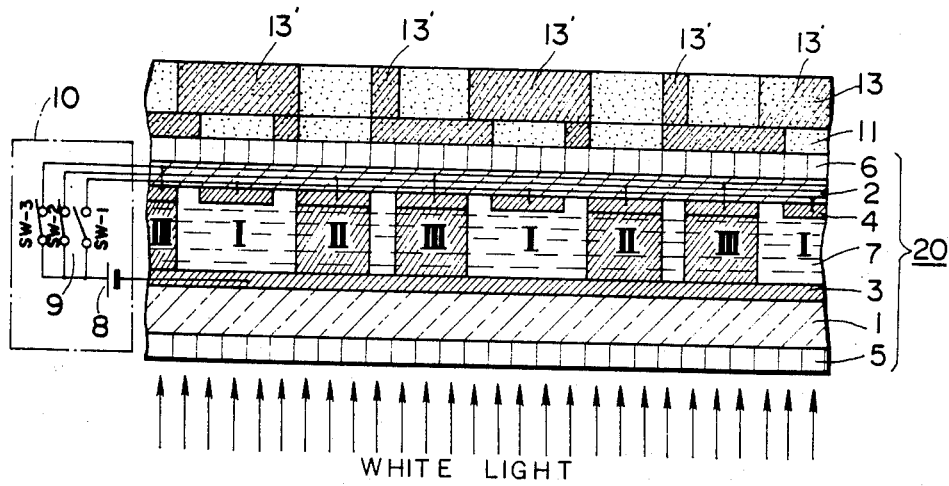
Figure 4G:
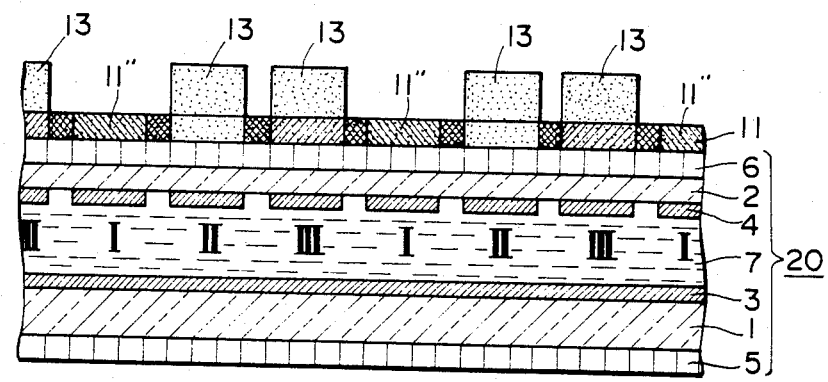
Figure 4H:
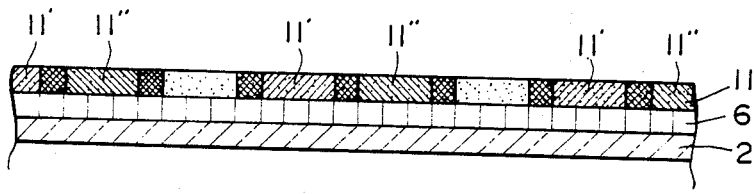
Figure 4I:
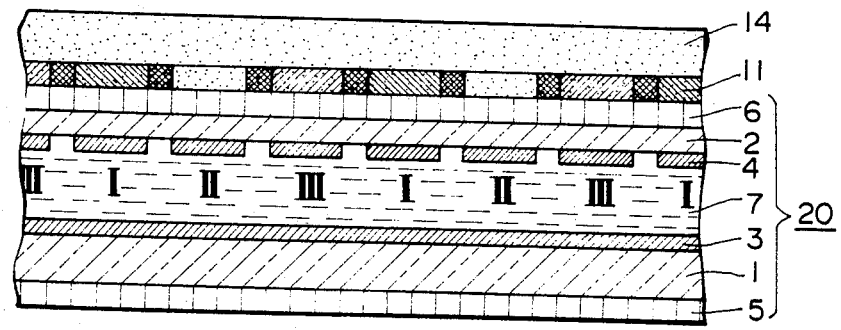
Figure 4J:
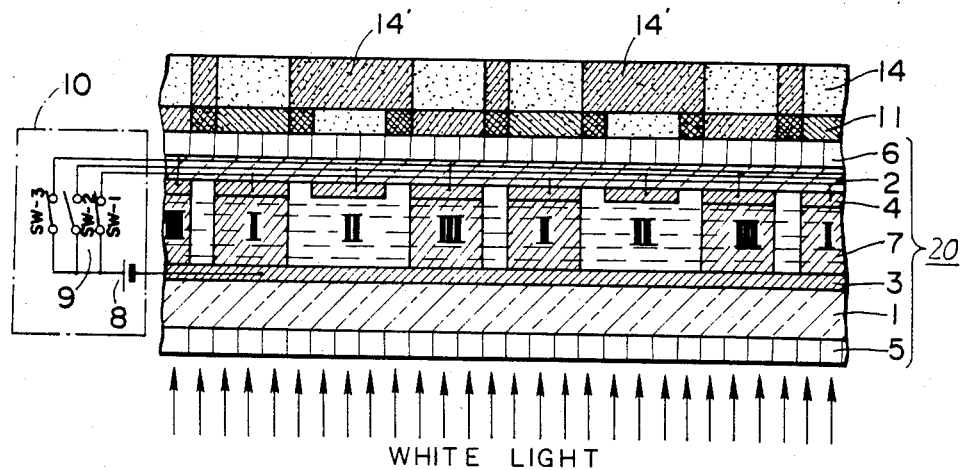
Figure 4K:
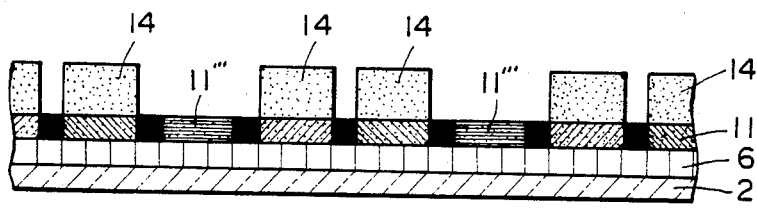
Figure 4L:
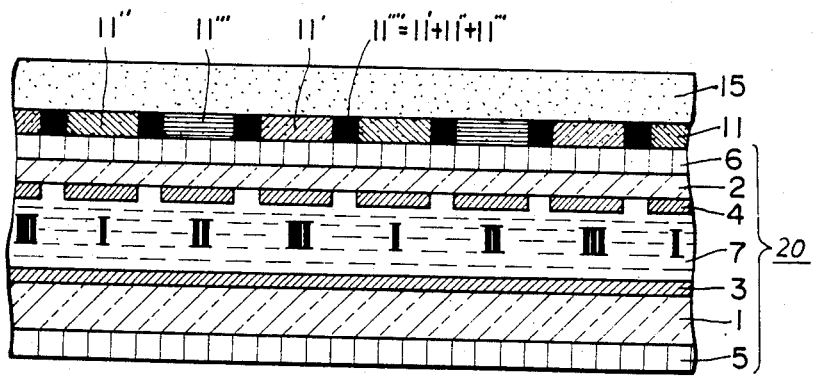

FIGS. 4 (A) to 4 (L) show a fabricating process and a finished product of a second embodiment of the invention formed in the photolithographic method by superposing a single filter sheet with multicolor filter elements 11', 11'', 11''' on one surface of a liquid crystal shutter device 20, the liquid crystal shutter device 20 having a pair of opposed glass plates 1, 2; opposed electrode groups 3, 4 on the respective inner surfaces of the glass plates 1, 2; at least one polarizer 5 or 6; a liquid crystal layer 7 sealed between the opposed electrode groups 3, 4; and a voltage applying means 10 for selectively applying a voltage across the electrode groups 3, 4.

Referring now to FIG. 4 (A), a layer being colored 11 of gelatin and the like was first deposited on the polarizer 6, and a first photoresist layer 12 of a positive type was deposited thereon. Next, as shown in FIG. 4 (B), while the liquid crystal shutter device 20 was illuminated from the rear by white light, SW-1 and SW-2 were closed with SW-3 open to apply a voltage to the selected portions of the liquid crystal layer 7. As a result, the light was prevented from passing through the portions I and II of the liquid crystal layer 7 corresponding to the electrode groups to which the voltage was applied, and latent images 12' were formed on the portions of the first photoresist layer 12 exposed to the light. These exposed portions carrying latent images 12' became soluable in a developer. This made a difference in solubility between the exposed and unexposed portions with respect to a developer. Furthermore, addition of a developer dissolved and removed only the latent image portions 12' of the first photoresist layer 12 to form a first pattern mask having holes. A dye of one of the three primary colors, for example, blue, was poured into the holes in the first pattern mask to form first colored portions 11' as shown in FIG. 4 (C). The first pattern mask was scraped off as shown in FIG. 4 (D).

In FIG. 4 (E), on the upper surface of the layer being colored 11 was formed a second photoresist layer 13 of the positive type. Then, as shown in FIG. 4 (F), while the liquid crystal shutter device 20 was illuminated from the rear by white liquid, SW-2 and SW-3 were closed with SW-1 open to apply the voltage to the selected portions of the liquid crystal layer 7. As a result, the light was prevented from passing through the portions II and III of the liquid crystal layer 7 corresponding to the electrode groups to which the voltage was applied, and latent images 13' were formed on the portions of the second photoresist layer 13 exposed to the light. Furthermore, addition of the developer dissolved and removed only latent image portions 13' of the second photoresist layer 13 to form a pattern mask having holes. A dye of another color of the three primary colors, for example, red, was poured into the holes in the second pattern mask 13 to form second colored portions 11" as shown in FIG. 4 (G). The second pattern mask was scraped off as shown in FIG. 4 (H).

In FIG. 4 (I), on the upper surface of the layer being colored 11 was formed a third photoresist layer 14 of the positive type. Then, as shown in FIG. 4 (J), while the liquid crystal shutter device was illuminated from the rear by white light, SW-1 and SW-3 were closed with SW-3 open to apply the voltage to the selected portions of the liquid crystal layer 7. As a result, the light was prevented from passing through the portions I and III of the liquid crystal layer 7 corresponding to the electrode groups to which the voltage was applied through SW-1 and SW-3, and latent images 14' were formed on the portions of the third photoresist layer 14 exposed to the light. Furthermore, addition of the developer dissolved and removed only the latent image portions 14' of the third photoresist layer 14 to form a pattern mask having holes. Furthermore, a dye of the remaining color of the three primary colors, for example, green, was poured into the holes in the third pattern mask to form the third colored portions 11''' as shown in FIG. 4 (K). Finally, on the third colored portions 11''' was formed a diffusion preventing layer 15 as shown in FIG. 4 (L).

In this photolithographic method, there was provided a filter shown in FIG. 4 (L), having portions colored in each of the three primary colors in the single layer and black colored portions where these colors overlapped, and aligned with the electrodes of the liquid crystal shutter device. When viewed from the top of the filter of the second embodiment, colors appeared as shown in FIGS. 5 (A) and 5 (B), like the first embodiment.

As described in detail with respect to the embodiments, the color filter of the liquid crystal display device according to the invention comprises a single layer or a plurality of layers in self alignment with electrode groups of the liquid crystal shutter device fabricated in the photolithographic method. The device of the invention eliminates the needs for preparing a special mask for exposure and performing operations of mechanical mask alignment. Therefore, no error creeps in, and a color filter of excellent quality can easily be fabricated at a low cost. This invention has a great industrial effect.

What is claimed is:

1. A process for making a liquid crystal display device having a color filter by a photolithographic method, the process comprising the steps of:
   providing a liquid crystal shutter device having:
      a pair of opposed glass plates;
      opposed electrode groups on the respective inner surfaces of the glass plates;
      at least one polarizer;
      a liquid crystal layer between the opposed electrode groups; and
      a voltage applying means for selectively applying a voltage applying means for selectively applying a voltage across the electrode groups;
   forming a layer being colored on one surface of the liquid crystal shutter device;
   forming a photoresist layer thereon;
   while illuminating the liquid crystal shutter device from the other surface thereof by white light, applying the voltage across the selected opposed electrode groups through the voltage applying means to form a latent image on the photoresist layer by a photochemical action, the latent image being aligned with the electrode groups;
   developing the latent image to form a photomask;
   after a while, while using the photomask as a guide, coloring the layer being colored to form a color filter layer; and
   forming a diffusion preventing layer on the color filter layer for protecting the color filter layer.

2. A process for making a liquid crystal display device having a color filter by a photolithographic method, the process comprising the steps of:
   providing a liquid crystal shutter device having:
      a pair of opposed glass plates;
      opposed electrode groups on the respective inner surfaces of the glass plates;
      at least one polarizer;
      a liquid crystal layer between the opposed electrode groups; and
      a voltage applying means for selectively applying a voltage across the electrode groups;
   forming a first layer being colored on one surface of the liquid crystal shutter device;
   forming a first photoresist layer of a negative type thereon;
   while illuminating the liquid crystal shutter device from the other surface thereof by white light, applying the voltage across the first selected opposed electrode groups through the voltage applying means to prevent the light from passing through a portion of the liquid crystal layer to which the voltage is applied and to expose a portion of the photoresist layer sensitive to light, thereby forming a first pattern latent image, the first latent image being hardened;
   developing the first latent image to form a first pattern mask;
   while using the mask as a guide, etching away the portion of the first layer being colored corresponding to the first selected opposed electrode groups;
   removing the mask;
   coating and dying the unetched portion of the first layer being colored with a first color of three primary colors to form a first colored layer;
   forming a first diffusion preventing layer on an upper surface of the first colored layer;
   forming a second layer being colored and a second photoresist layer of the negative type on an upper surface of the first preventing layer;
   while illuminating the liquid crystal shutter device from the other surface thereof by white light, applying the voltage across the second selected opposed electrode groups through the voltage applying means to prevent the light from passing through a portion of the liquid crystal layer to which the voltage is applied and to expose a portion of the second photoresist layer sensitive to the light, thereby forming a second pattern latent image, the second pattern latent image being hardened;
   developing the second latent image to form a second pattern mask,
   while using the mask as a guide, etching away the portion of the second layer being colored corresponding to the second selected opposed electrode groups;
   removing the second pattern mask;
   coating and dyeing the unetched portion of the second layer being colored with a second color of the three primary colors to form a second colored layer;

forming a second diffusion preventing layer on an upper surface of the second colored layer;

forming a third layer being colored and a third photoresist layer of the negative type on an upper surface of the second preventing layer;

while illuminating the liquid crystal shutter device from the other surface thereof by white light, applying the voltage across the third selected opposed electrode groups through the voltage applying means to prevent the light from passing through a portion of the liquid crystal layer to which the voltage is applied and to expose a portion of the third photoresist layer sensitive to the light, thereby forming a third pattern latent image, the third pattern latent image being hardened;

developing the second latent image to form a second pattern mask;

while using the mask as a guide, etching away the portion of the third layer being colored corresponding to the third selected opposed electrode groups;

removing the third pattern mask;

coating and dyeing the unetched portion of the third layer being colored with a third color of the three primary colors to form a third colored layer; and forming a third diffusion preventing layer on an upper surface of the third colored layer.

3. A process for making a liquid crystal display device having a color filter by a photolithographic method, the process comprising the steps of:

providing a liquid crystal shutter device having:
a pair of opposed glass plates;
opposed electrode groups on the respective inner surfaces of the glass plates;
at least one polarizer;
a liquid crystal layer between the opposed electrode groups; and
a voltage applying means for selectively applying a voltage across the electrode groups;

forming a layer being colored on one surface of the liquid crystal shutter device;

forming a first photoresist layer of a positive type thereon;

while illuminating the liquid crystal shutter device from the other surface thereof by white light, applying the voltage across the first selected opposed electrode groups through the voltage applying means to prevent the light from passing through a portion of the liquid crystal to which the voltage is applied and to expose a portion of the first photoresist layer sensitive to the light, thereby forming a first latent image which is soluble;

developing the latent image to leave the unexposed portion of the first photoresist layer, thereby forming a mask for a first coloring guide;

pouring a dye of a first color of three primary colors into the first layer being colored from a hole therein caused by the solution of the mask to form a first colored portion;

removing the mask for a first coloring guide to reveal the layer being colored having the first colored portion;

forming a second photoresist layer of the positive type on an upper surface of the layer being colored;

while illuminating the liquid crystal shutter device from the other surface thereof by white light, applying the voltage across the second selected opposed electrode groups through the voltage applying means to prevent the light from passing through a portion of the light crystal to which the voltage is applied and to expose a portion of the second photoresist layer sensitive to light, thereby forming a second latent image which is soluble;

developing the latent image to leave the unexposed portion of the second photoresist layer, thereby forming a mask for a second coloring guide;

pouring a dye of a second color of the three primary colors into the second layer being colored from a hole therein caused by the solution of the mask to form a second colored portion;

removing the mask for a second coloring guide to reveal the layer being colored having the first and second colored portions;

forming a third photoresist layer of the positive type of the upper surface of the layer being colored;

while illuminating the liquid crystal shutter device from the other surface thereof by white light, applying the voltage across the third selected opposed electrode groups through the voltage applying means to prevent the light from passing through a portion of the liquid crystal to which the voltage is applied and to expose a portion of the third photoresist layer sensitive to the light, thereby forming a third latent image which is soluble;

developing the latent image to leave the unexposed portion of the third photoresist layer, thereby forming a mask for a third coloring guide;

pouring a dye of a third color of the three primary colors into the third layer being colored from a hole therein caused by the solution of the mask to form a third colored portion;

removing the mask for a third coloring guide to reveal the layer having the first, second and third colored portions, part of the first, second and third portions being overlapping; and forming a diffusion preventing layer on the upper surface of the layer having the first, second and third colored portions.

* * * * *